(12) United States Patent
Lee et al.

(10) Patent No.: US 12,324,115 B2
(45) Date of Patent: Jun. 3, 2025

(54) HOUSING OF ELECTRONIC DEVICE WITH DIFFERENT BONDED METALS AND METHOD OF MANUFACTURING THE SAME

(71) Applicant: SAMSUNG ELECTRONICS CO., LTD., Suwon-si (KR)

(72) Inventors: Yoonhee Lee, Suwon-si (KR); Youngoh Kim, Suwon-si (KR); Juncheol Shin, Suwon-si (KR); Seungchang Baek, Suwon-si (KR); Sungho Cho, Suwon-si (KR); Hangyu Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 228 days.

(21) Appl. No.: 17/847,871

(22) Filed: Jun. 23, 2022

(65) Prior Publication Data

US 2022/0418135 A1   Dec. 29, 2022

Related U.S. Application Data

(63) Continuation of application No. PCT/KR2022/006327, filed on May 3, 2022.

(30) Foreign Application Priority Data

Jun. 9, 2021   (KR) .......................... 10-2021-0074663

(51) Int. Cl.
*H05K 5/04* (2006.01)
*B29C 45/14* (2006.01)
(Continued)

(52) U.S. Cl.
CPC ..................................... *H05K 5/04* (2013.01)

(58) Field of Classification Search
CPC .. H05K 5/04; H05K 5/0018; B29C 45/14311; H04M 1/0283; H04M 1/0202; C23C 4/06; C25D 11/04
See application file for complete search history.

(56) References Cited

U.S. PATENT DOCUMENTS 6,284,391 B1    9/2001  Crook
2019/0098785 A1*  3/2019  Mintz .................... C25D 11/08
(Continued)

FOREIGN PATENT DOCUMENTS

JP      9-300529 A      11/1997
JP      2001-203472 A    7/2001
(Continued)

OTHER PUBLICATIONS

Communication dated Aug. 12, 2022, issued by the International Searching Authority in counterpart International Application No. PCT/KR2022/006327 (PCT/ISA/210).
(Continued)

*Primary Examiner* — Hoa C Nguyen
*Assistant Examiner* — Amol H Patel
(74) *Attorney, Agent, or Firm* — Sughrue Mion, PLLC

(57) ABSTRACT

A housing of an electronic device includes two or more metal portions, each having an oxide film layer formed on a surface thereof, and a non-conductive portion formed to cover at least a portion of the oxide film layer.

17 Claims, 12 Drawing Sheets

(51) Int. Cl.
  *C23C 4/06*   (2016.01)
  *C25D 11/04*  (2006.01)
  *H04M 1/02*   (2006.01)

(56) References Cited

U.S. PATENT DOCUMENTS

2021/0348293 A1* 11/2021 Nunomura ............. C25D 11/08
2021/0370635 A1* 12/2021 Hon ....................... C25D 11/12

FOREIGN PATENT DOCUMENTS

| | | |
|---|---|---|
| JP | 2003-313684 A | 11/2003 |
| KR | 10-1399835 B1 | 5/2014 |
| KR | 10-2015-0017742 A | 2/2015 |
| KR | 10-2019-0028304 A | 3/2019 |
| KR | 10-2019-0030121 A | 3/2019 |
| KR | 10-2020-0094950 A | 8/2020 |
| KR | 10-2205058 B1 | 1/2021 |
| WO | 2019/050040 A1 | 3/2019 |

OTHER PUBLICATIONS

Office Action issued Mar. 31, 2025 by the Korean Patent Office for KR Patent Application No. 10-2021-0074663.

* cited by examiner

HOUSING OF ELECTRONIC DEVICE WITH DIFFERENT BONDED METALS AND METHOD OF MANUFACTURING THE SAME

CROSS-REFERENCE TO RELATED APPLICATIONS

This application is a bypass continuation of International Application No. PCT/KR2022/006327 designating the United States, filed on May 3, 2022, in the Korean Intellectual Property Receiving Office and claiming priority to Korean Patent Application No. 10-2021-0074663, filed on Jun. 9, 2021, in the Korean Intellectual Property Office, the disclosures of which are incorporated by reference herein in their entireties.

BACKGROUND

1. Field

The disclosure relates to a housing of an electronic device with different bonded metals and a method of manufacturing the housing.

2. Description of Related Art

An electronic device refers to a device that performs a specific function according to a loaded program, such as a home appliance, an electronic notepad, a portable multimedia player, a mobile communication terminal, a tablet personal computer (PC), a video/audio device, a desktop/laptop computer, a vehicle navigation system, and the like. For example, such electronic devices may output stored information as sound or images. Along with an increase in the integration level of electronic devices and the increasing popularity of ultra-high-speed, large-capacity wireless communication, various functions have recently been loaded in a single electronic device, such as a mobile communication terminal. For example, an entertainment function such as gaming, a multimedia function such as music/video play, a communication and security function for mobile banking, a scheduling function, and an electronic wallet function as well as a communication function have been integrated in a single electronic device.

An electronic device includes a housing formed of various materials, and the housing of the electronic device may protect internal components of the electronic device from external impact. The housing may be manufactured such that the device is easy for a user to carry and to provide the user with a good appearance when used.

SUMMARY

Research has been conducted on a metal bonded body of which an outer portion is formed using a metal with an excellent brightness and strength and an inner portion is formed using a light metal for an exterior quality and lightening of an electronic device. However, a sufficient bonding strength for bonding to a non-conductive portion may not be secured. Also, when two or more metals that are greatly different in electrical conductance are bonded, a formation of an oxide film layer may be limited, and the non-conductive portion may be easily separated.

According to various example embodiments, there is provided a housing of an electronic device in which two or more metals are bonded and a non-conductive portion is coupled.

According to various example embodiments, there is provided a housing of an electronic device in which an oxide film layer is formed on a surface of each of two or more metal portions and includes a plurality of pores and in which a non-conductive portion is formed to cover at least a portion of a bonding portion between oxide film layers.

In accordance with an aspect of the disclosure, a housing of an electronic device includes a first metal portion including a first metal; a second metal portion including a second metal; and a non-conductive portion, wherein a first oxide film layer is formed on at least a portion of a surface of the first metal portion, wherein the first oxide film layer includes a plurality of first pores, each of the plurality of first pores having a respective first diameter in a first range, wherein the second metal portion contacts the first metal portion, wherein a second oxide film layer is formed on at least a portion of a surface of the second metal portion, wherein the second oxide film layer includes a plurality of second pores, each of the plurality of second pores having a respective second diameter in a second range, and wherein the non-conductive portion covers at least a portion of a bonding portion between the first oxide film layer and the second oxide film layer.

The first metal and the second metal may be different from each other.

The first metal and the second metal may each include at least one selected from a group consisting of Ti, Al, Mg, Zn, stainless steel, Cu, a liquid metal, and a mixture thereof.

The first range may be less than the second range.

The first oxide film layer may have a first thickness, the second oxide film layer may have a second thickness, and each of the first thickness and the second thickness may be greater than or equal to 100 nanometers (nm).

Each of the first oxide film layer and the second oxide film layer may include an oxygen atom in an amount of 1 atomic percent (at. %) or greater and a fluorine atom in an amount of 0.01 at. % or greater.

The non-conductive portion may fill either one or both of the plurality of first pores and the plurality of second pores.

The non-conductive portion may include at least one selected from a group consisting of polybutylene terephthalate (PBT), polycarbonate (PC), polyphenylene sulfide (PPS), acrylonitrile butadiene styrene (ABS), polyimide (PI), polyoxymethylene (POM), polyether ether ketone (PEEK), polyaryletherketone (PAEK), polyphenylene oxide (PPO), and a mixture thereof.

The non-conductive portion may further include at least one additive selected from a group consisting of a glass fiber, a carbon fiber, talc, wollastonite, and a mixture thereof.

A bonding strength between the first metal portion and the second metal portion may be 10 megapascals (MPa) to 100 MPa, and a bonding strength of each of the first metal portion and the second metal portion with the non-conductive portion may be 25 MPa or greater.

Each of the first oxide film layer and the second oxide film layer may include a fluorine atom in an amount of 1 at. % or greater.

A coating layer may be formed on at least a second portion of the surface of either one or both of the first metal portion and the second metal portion.

A coating layer may not be formed on a surface of the non-conductive portion.

The coating layer may include at least one selected from a group consisting of $Be_2SiO_4$, $Zn_2SiO_4$, $ZrSiO_4$, $(M_1^{2+})_3(M_2^{3+})_2(SiO_4)_3$ ($M_1$ is at least one of Ca, Mg and Fe, and $M_2$ is at least one of Al, Cr and Fe), a polyfunctional (meth)acrylate polymer having a (meth)acryl group, a polyfunctional urethane (meth)acrylate oligomer having 6 to 15 (meth)acryl groups, a polyfunctional (meth)acrylate monomer having 2 to 6 (meth)acryl groups, a fluorinated (meth) acrylate monomer, and a mixture thereof.

In accordance with an aspect of the disclosure, an electronic device includes a housing, wherein the housing includes a first metal portion including a first metal; a second metal portion including a second metal; and a non-conductive portion, wherein a first oxide film layer is formed on at least a portion of a surface of the first metal portion, wherein the first oxide film layer includes a plurality of first pores having a first diameter, wherein the second metal portion contacts the first metal portion, wherein a second oxide film layer is formed on at least a portion of a surface of the second metal portion, wherein the second oxide film layer includes a plurality of second pores having a second diameter, and wherein the non-conductive portion covers at least a portion of a bonding portion between the first oxide film layer and the second oxide film layer.

The first metal and the second metal may each include at least one selected from a group consisting of Ti, Al, Mg, Zn, stainless steel, Cu, a liquid metal, and a mixture thereof, and each of the first oxide film layer and the second oxide film layer may include an oxygen atom in an amount of 1 atomic percent (at. %) or greater and a fluorine atom in an amount of 0.01 at. % or greater.

The electronic device may include at least one of a portable electronic device, a wearable electronic device, and a laptop.

In accordance with an aspect of the disclosure, a method of manufacturing a housing of an electronic device includes forming a metal bonded body by bonding a first metal to a second metal; anodizing the metal bonded body by immersion in a first solution; and injecting a resin onto the metal bonded body.

The first solution may include at least one selected from a group consisting of ammonium bifluoride, hydrofluoric acid, sodium fluoride, potassium fluoride, ammonium fluoride, and a mixture thereof in an amount of 0.1% by weight (wt %) to 5 wt %.

The first solution may further include a sulfuric acid, and the first solution may further include at least one additive selected from a group consisting of a hydrochloric acid, a phosphoric acid, a nitric acid, an oxalic acid, a chromic acid, a sulfamic acid, a malonic acid, an organic acid, a sodium hydroxide, a sodium sulfate, and a mixture thereof.

In accordance with an aspect of the disclosure, a housing of an electronic device includes a first metal portion including a plurality of first protrusions on a surface of the first metal portion, the plurality of first protrusions forming a first antenna radiator; and a non-conductive portion on the surface of the first metal portion and filling spaces between adjacent first protrusions of the plurality of first protrusions.

The housing may further include a second metal portion bonded to the first metal portion, the second metal portion including a plurality of second protrusions on a surface of the second metal portion, the plurality of second protrusions forming a second antenna radiator.

The non-conductive portion may be formed on the surface of the second metal portion and fill spaces between adjacent second protrusions of the plurality of second protrusions.

BRIEF DESCRIPTION OF THE DRAWINGS

The above and other aspects, features, and advantages of certain embodiments of the disclosure will be more apparent from the following detailed description, taken in conjunction with the accompanying drawings, in which.

DETAILED DESCRIPTION

Figure 1:
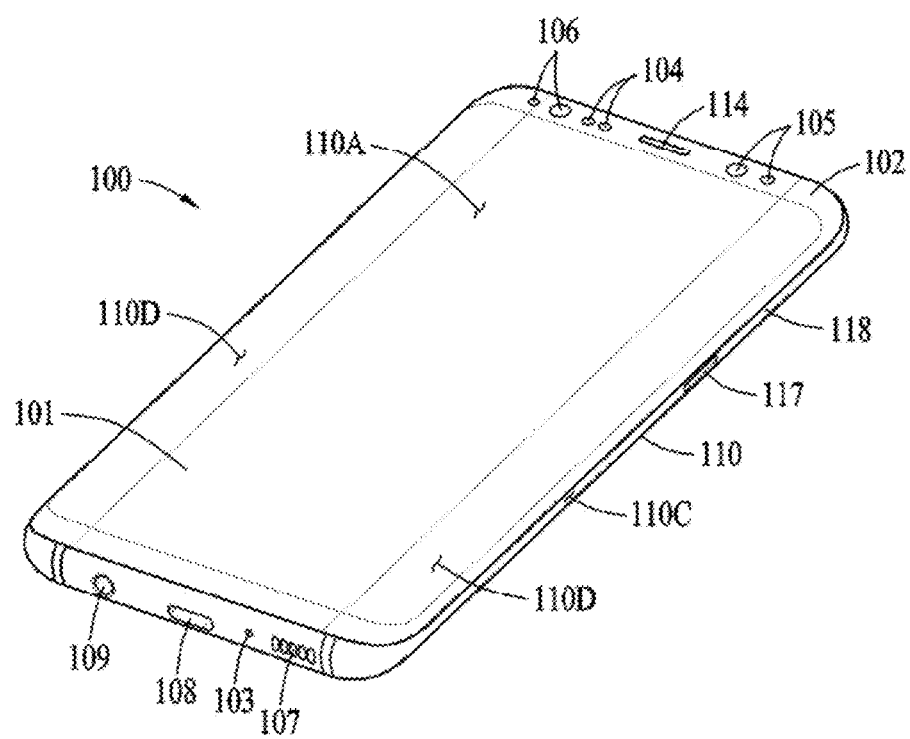
FIG. 1 is a perspective view illustrating a front surface of a mobile electronic device according to an embodiment.

Hereinafter, example embodiments will be described in detail with reference to the accompanying drawings. When describing the example embodiments with reference to the accompanying drawings, like reference numerals refer to like elements and a repeated description related thereto will be omitted.

Figure 2:
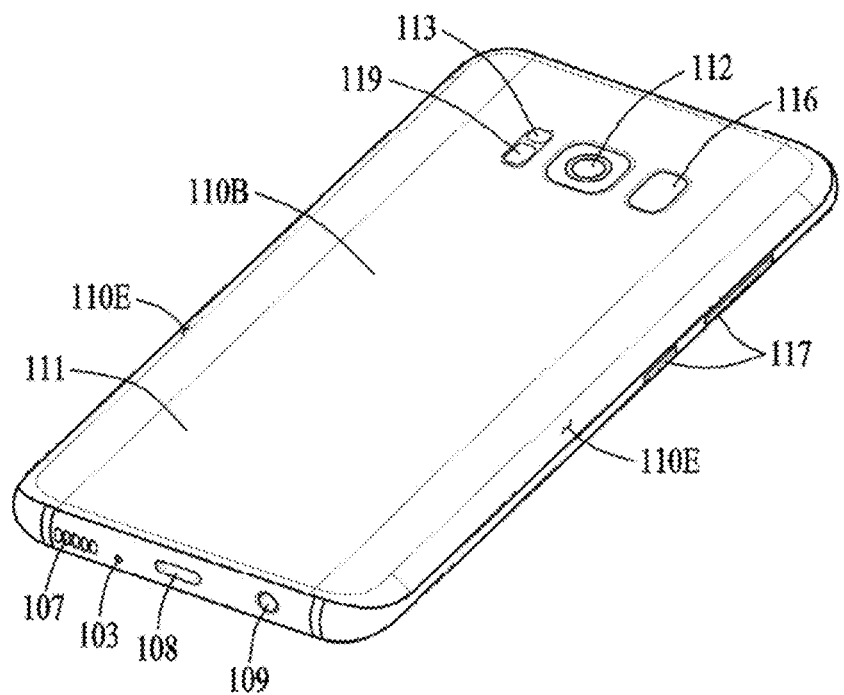
FIG. 2 is a perspective view of a rear surface of the electronic device of FIG. 1.

Referring to FIGS. 1 and 2, an electronic device 100 according to an example embodiment may include a housing 110 including a first face (or a front face) 110A, a second face (or a rear face) 110B, and a side face 110C surrounding a space between the first face 110A and the second face 110B. In an example embodiment, the housing may also refer to a structure which forms a portion of the first face 110A, the second face 110B, and the side face 110C of FIG. 1. According to an example embodiment, the first surface 110A may be formed by a front plate 102 (e.g., a polymer plate or a glass plate including various coating layers) which is at least partially transparent. The second surface 110B may be formed of a rear plate 111 that is substantially opaque. For example, the rear plate 111 may be formed of coated or colored glass, ceramic, polymer, metal materials (e.g. aluminum, stainless steel (SS), or magnesium) or a combination of at least two of the above materials. The side surface 110C may be coupled to the front plate 102 and the rear plate 111 and may be formed by a side bezel structure (or a side member) 118 including metal and/or polymer. In some example embodiments, the rear plate 111 and the side bezel structure 118 may be formed integrally and may include the same material (e.g., a metal material such as aluminum).

In the illustrated example embodiment, the front plate 102 may include two first regions 110D seamlessly extended by being bent from the first face 110A toward the rear plate 111 at both ends of a long edge of the front plate 102 (e.g., at both long edges of the front plate 102). In the illustrated example embodiment (see FIG. 2), the rear plate 111 may include two second regions 110E seamlessly extended by being bent from the second face 110B toward the front plate 102 at both ends of a long edge. In some example embodiments, the front plate 102 (or the rear plate 111) may include one of the first regions 110D (or the second regions 110E). In an example embodiment, some of the first regions 110D or the second region 110E may not be included. In the above example embodiments, in a side view of the electronic device 100, the side bezel structure 118 may have a first thickness (or width) at a side in which the first regions 110D or the second regions 110E are not included, and may have a second thickness less than the first thickness at a side in which the first regions 110D or the second regions 110E are included.

According to an example embodiment, the electronic device 100 may include at least one of a display 101, audio modules 103, 107, and 114, sensor modules 104, 116, and 119, camera modules 105, 112, and 113, a key input device 117, a light emitting element 106, and connector holes 108 and 109. In some example embodiments, the electronic device 100 may not include at least one of components (e.g., the key input device 117 or the light emitting element 106) or additionally include other components.

The display 101 may be exposed through, for example, some portions of the front plate 102. In some example embodiments, at least a portion of the display 101 may be exposed through the first face 110A and the front plate 102 constructing the first regions 110D of the side face 110C. In some example embodiments, edges of the display 101 may be formed to be substantially the same as the shape of the periphery of the front plate 102 adjacent thereto. In an example embodiment, the distance between the periphery of the display 101 and the periphery of the front plate 102 may be substantially constant in order to enlarge the exposed area of the display 101.

In an example embodiment, a recess or an opening may be formed in a portion of a screen display region of the display 101, and at least one of the audio module 114, the sensor module 104, and the camera module 105, and the light emitting element 106 that are aligned with the recess or the opening may be included. In an example embodiment, a rear face of the screen display region of the display 101 may include at least one of the audio module 114, the sensor module 104, the camera module 105, the sensor module 116 (e.g., fingerprint sensor), and the light emitting element 106. In another example embodiment, the display 101 may be coupled to or arranged adjacent to a touch sensing circuit, a pressure sensor for measuring an intensity (pressure) of a touch, and/or a digitizer for detecting a magnetic-type stylus pen. In some example embodiments, at least a portion of the sensor modules 104 and 119, and/or at least a portion of the key input device 117 may be disposed in the first regions 110D and/or the second regions 110E.

The audio modules 103, 107, and 114 may include a microphone hole (e.g., the audio module 103) and speaker holes (e.g., the audio modules 107 and 114). A microphone for acquiring external sound may be disposed in the microphone hole e.g., the audio module 103). In some example embodiments, a plurality of microphones may be disposed to detect a direction of sound. The speaker holes (e.g., the audio modules 107 and 114 e.g.) may include an external speaker hole (e.g., the audio module 107) and a receiver hole (e.g., the audio module 114) for a call. In some example embodiments, the speaker holes (e.g., the audio modules 107 and 114) and the microphone hole (e.g., the audio module 103) may be implemented as one hole, or a speaker (e.g., a Piezo speaker) may be included without the speaker holes (e.g., the audio modules 107 and 114).

The sensor modules 104, 116, and 119 may generate an electrical signal or a data value corresponding to an internal operating state of the electronic device 100 or an external environmental state. The sensor modules 104, 116, and 119 may include, for example, the first sensor module 104 (e.g., a proximity sensor) and/or second sensor module (e.g., a fingerprint sensor) disposed on the first face 110A of the housing 110, and/or the third sensor module 119 (e.g., a heart rate monitoring (HRM) sensor) disposed on the second face 110B of the housing 110 and/or the fourth sensor module 116 (e.g., a fingerprint sensor). The fingerprint sensor may be disposed on both the first face 110A (e.g., the display 101) and the second face 110B of the housing 110. The electronic device 100 may further include at least one of sensor modules, for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illuminance sensor.

The camera modules 105, 112, and 113 may include a first camera module 105 disposed on the first face 110A of the electronic device 100, a second camera module 112 disposed on the second face 110B, and/or a flash 113. The camera modules 105 and 112 may each include one or more lenses, an image sensor, and/or an image signal processor. The flash 113 may include, for example, a light-emitting diode (LED) or a xenon lamp. In some example embodiments, two or more lenses (IR cameras, wide angle and telephoto lenses) and image sensors may be disposed on at least one face of the electronic device 100.

The key input device 117 may be disposed on the side surface 110C of the housing 110. In an example embodiment, the electronic device 100 may not include some or all of the above-described key input device 117. The key input device 117 that is not included may be implemented in another form such as a soft key on the display 101. In some example embodiments, the key input device may include the sensor module 116 disposed on the second face 110B of the housing 110.

The light emitting element 106 may be disposed on, for example, the first face 110A of the housing 110. The light emitting element 106 may provide, for example, state information of the electronic device 100 in a form of light. In an example embodiment, the light emitting element 106 may provide, for example, a light source that is linked to the operation of the camera module 105. The light emitting element 106 may include, for example, an LED, an IR LED, and a xenon lamp.

The connector holes 108 and 109 may include a first connector hole 108 for accommodating a connector (e.g., a universal serial bus (USB) connector) for transmitting and receiving power and/or data to and from an external electronic device, and/or a second connector hole (e.g., an earphone jack) 109 for accommodating a connector for transmitting and receiving an audio signal to and from an external electronic device.

Figure 3:
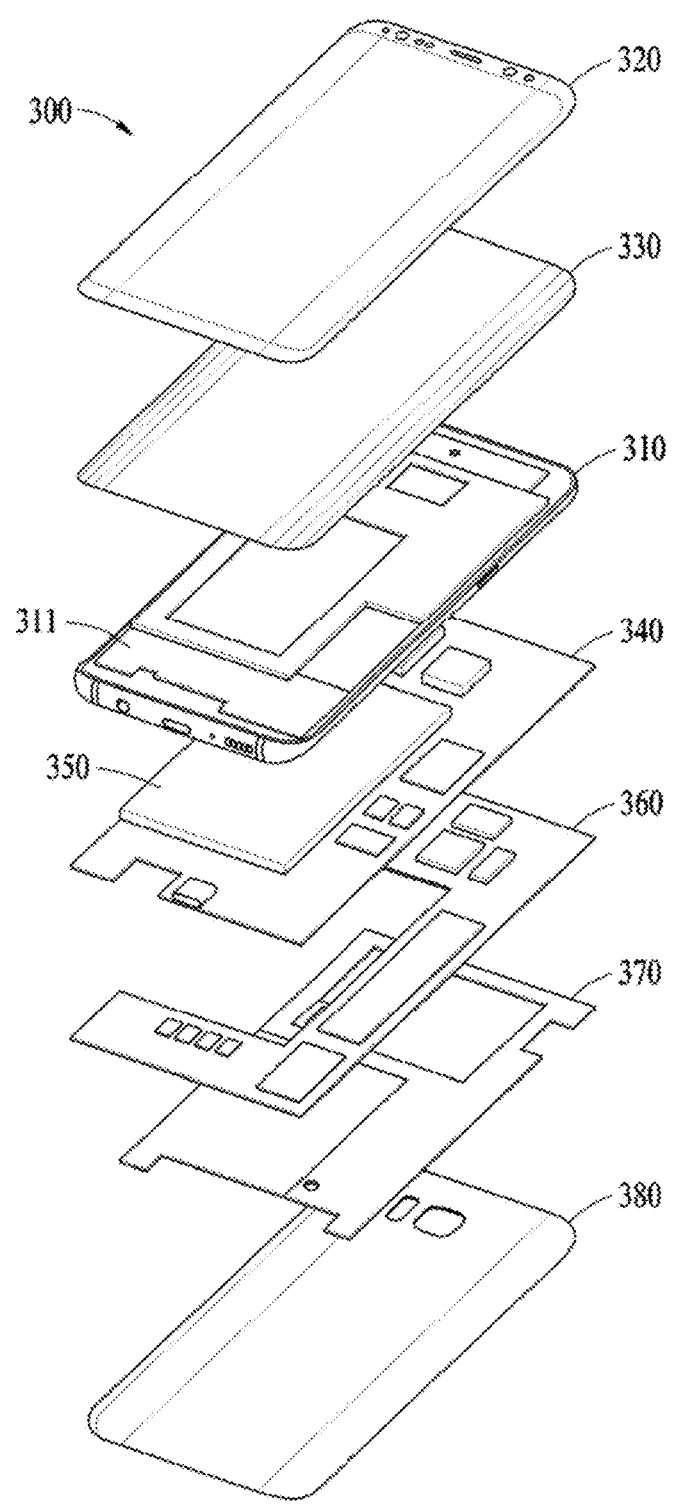
FIG. 3 is an exploded perspective view of the electronic device of FIG. 1.

Referring to FIG. 3, an electronic device 300 may include a side bezel structure 310, a first support member 311 (e.g., a bracket), a front plate 320, a display 330, a printed circuit board (PCB) 340, a battery 350, a second support member 360 (e.g., a rear case), an antenna 370, and a rear plate 380. In some example embodiments, the electronic device 300 may omit at least one (e.g., the first support member 311 or the second support member 360) of the components, or may additionally include other components. At least one of the components of the electronic device 300 may be the same as or similar to at least one of the components of the electronic device 100 of FIG. 1 or 2, and a repeated description thereof will be omitted here.

The first support member 311 may be disposed inside the electronic device 300 and connected to the side bezel structure 310, or formed integrally with the side bezel structure 310. The first support member 311 may be formed of, for example, a metal material and/or a non-metal material (e.g., polymer). The display 330 may be connected to one surface of the first support member 311, and the PCB 340 may be connected to another surface of the first support member 311. A processor, a memory, and/or an interface may be mounted on the PCB 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a high-definition multimedia interface (HDMI), a USB interface, a secure digital (SD) card interface, or an audio interface. For example, the interface may electrically or physically connect the electronic device 300 to an external electronic device, and may include a USB connector, an SD card/multimedia card (MMC) connector, or an audio connector.

The battery 350 may be a device for supplying power to at least one component of the electronic device 300, and may include, for example, a primary cell which is not rechargeable, a rechargeable secondary cell, or a fuel cell. For example, at least a portion of the battery 350 may be disposed on substantially the same plane as the PCB 340. The battery 350 may be disposed integrally inside the electronic device 300, or disposed detachably from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or may wirelessly transmit and receive power required for charging to and from the external device. In an example embodiment, an antenna structure may be formed by a portion of the side bezel structure 310 and/or the first support member 311 or a combination thereof.

Hereinafter, the housing 110 forming an external appearance of the electronic device 100 will be further described through various example embodiments.

Figure 4:
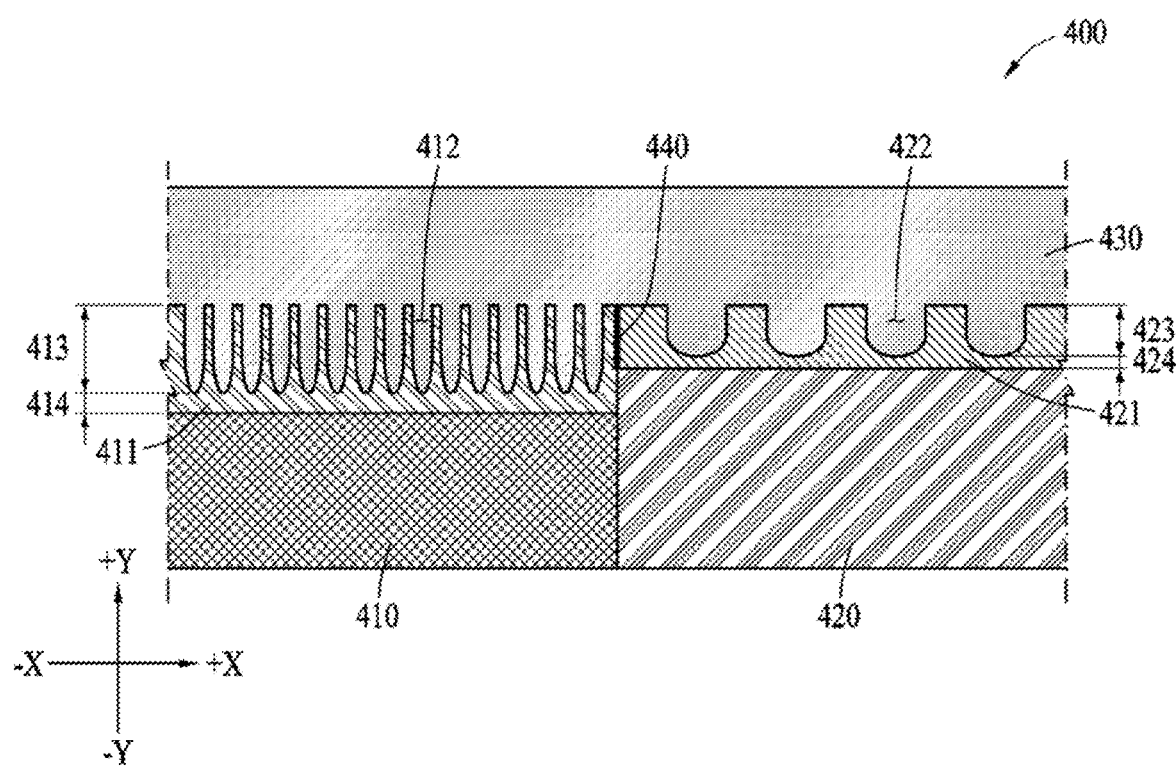
FIG. 4 is a cross-sectional view of a housing of an electronic device according to embodiments.

FIG. 4 is a cross-sectional view of a housing of an electronic device according to various example embodiments.

Referring to FIG. 4, a cross section of a portion (e.g., a portion of a side bezel) of a housing of an electronic device (e.g., the electronic device 100 of FIG. 1) is illustrated, and a housing 400 of an electronic device according to various example embodiments may include a metal portion and a non-conductive portion. According to an example embodiment, at least a portion of the metal portion may be used as an antenna radiator, and at least a portion of the non-conductive portion may be formed in the middle of the metal portion, to electrically disconnect at least a portion of the metal portion so that the metal portion may be used as an antenna radiator. A cross-section of a portion of the housing 400 including both the metal portion and the non-conductive portion is illustrated in FIG. 4, and at least another portion of the housing 400 (e.g., a portion used as an antenna radiator) may not include a non-conductive portion. For convenience of description, a +X direction and a −X direction of FIG. 4 are assumed as an outward direction (e.g., a direction toward an edge) and an inward direction (e.g., a direction toward a center) of the electronic device 100, respectively, however, directions in which the metal portion and the non-conductive portion are disposed are not limited.

According to various example embodiments, the housing 400 may include a first metal portion 410, a second metal portion 420, and a non-conductive portion 430.

According to various example embodiments, the first metal portion 410 may include a first metal, and a first oxide film layer 411 may be formed on at least a portion of a surface of the first metal portion 410.

According to various example embodiments, the second metal portion 420 may include a second metal, and a second oxide film layer 421 may be formed on at least a portion of a surface of the second metal portion 420.

According to various example embodiments, the first oxide film layer 411 may include a plurality of first pores 412 such that a plurality of first protrusions is formed between adjacent first pores 412, and the second oxide film layer 421 may include a plurality of second pores 422 such that a plurality of second protrusions is formed between adjacent second pores 422. At least one of a diameter and/or a depth of the first pores 412 and the second pores 422 may be the same or different.

According to various example embodiments, the first pores 412 may have a diameter in a first range, and the second pores 422 may have a diameter in a second range. The plurality of first pores 412 may be identical to or different from each other in at least one of a diameter, a height, and/or a shape. The plurality of second pores 422 may be identical to or different from each other in at least one of a diameter, a height, and/or a shape.

According to various example embodiments, the non-conductive portion 430 may be formed to cover at least a portion of a bonding portion 440 between the first oxide film layer 411 and the second oxide film layer 421. According to an example embodiment, an anodizing process may be performed in a state in which the first metal portion 410 and the second metal portion 420 are bonded, and accordingly the first oxide film layer 411 and the second oxide film layer 421 may be formed on the surface of the first metal portion 410 and the surface of the second metal portion 420, respectively. The formed first oxide film layer 411 and the formed second oxide film layer 421 may also be bonded to form the bonding portion 440.

According to various example embodiments, the first metal portion 410 and the second metal portion 420 may be formed to contact each other. For example, a +X direction surface of the first metal portion 410 and a −X direction surface of the second metal portion 420 may be bonded by welding, casting, or using an adhesive material.

According to various example embodiments, the first oxide film layer 411 and the second oxide film layer 421 formed on the surface of the first metal portion 410 and the surface of the second metal portion 420, respectively, may also be formed to contact each other. For example, the first oxide film layer 411 and the second oxide film layer 421 may be bonded to the first metal portion 410 and the second metal portion 420, respectively, through the anodizing process in a state in which the first metal portion 410 and the second metal portion 420 are bonded. The first oxide film layer 411 and the second oxide film layer 421 may form the bonding portion 440, and the non-conductive portion 430 may be formed to cover at least a portion of the bonding portion 440 between the first oxide film layer 411 and the second oxide film layer 421. For example, when the +X direction surface of the first metal portion 410 and the −X direction surface of the second metal portion 420 are formed to contact each other, a +X direction surface of the first oxide film layer 411 and a −X direction surface of the second oxide film layer 421 may at least partially contact each other to form the bonding portion 440.

According to various example embodiments, a plurality of pores open to the outside may be formed in each of the first oxide film layer 411 and the second oxide film layer 421, and the non-conductive portion 430 may be formed to fill each of the pores included in the first oxide film layer 411 and the second oxide film layer 421. For example, the first pores 412 and the second pores 422 may be formed in the first oxide film layer 411 and the second oxide film layer 421, respectively, to open in a +Y direction.

According to various example embodiments, the first oxide film layer 411 and the second oxide film layer 421 may be formed on the surface of the first metal portion 410 and the surface of the second metal portion 420, respectively, to assign a sufficient bonding strength for bonding to the non-conductive portion. If an oxide film layer is not formed on the metal portion, a sufficient bonding strength between the metal portion and the non-conductive portion may not be generated due to an insufficient bonding strength. For example, a bonding area may be increased by inner walls of pores formed in the oxide film layer, and accordingly an adhesion between the oxide film layer and the non-conductive portion may be increased.

According to various example embodiments, a plurality of pores may be formed in each of the first oxide film layer 411 and the second oxide film layer 421, and a resin injected in a process of forming the non-conductive portion 430 may be properly adhered due to the pores.

According to various example embodiments, the first metal and the second metal may be different. For example, the second metal included in the outward direction (e.g., the +X direction) may be a metal having at least one of a brightness and/or a strength greater than at least one of a brightness and/or a strength of the first metal. For example, as the second metal in the outward direction, a metal having a high strength for protecting the inside or having a high brightness for providing a fine view may be used. In another example, a weight of the first metal included in an inward direction (e.g., a −X direction) may be less than a weight of the second metal in the outward direction, with respect to the same size. In other words, a density of the first metal may be less than a density of the second metal. The first metal in the inward direction may include, for example, a metal for reducing a weight of the housing 400. The second metal may include, for example, Ti or stainless steel (SS). Also, the second metal may include, for example, an alloy. The second metal may include, for example, a Ti alloy having a purity of 80% or greater. The first metal may include, for example, Al. Also, the first metal may include, for example, an alloy. The first metal may include, for example, an Al alloy having a purity of 70% or greater. However, the type of the first metal and the second metal are not limited thereto. For example, it may be easily understood by one of ordinary skill in the art that a material, such as STS-Al, STS-Mg, Al—Mg, and Ti—Mg, formed by bonding different materials may also be used. In addition, attributes to be compared as the first metal and the second metal are disposed inside or outside the electronic device 100 are not limited to those described above, and all first metals and second metals suitable to be used inside or outside the housing 400 may be applicable to various example embodiments of the disclosure. The second metal in the outward direction may be, for example, a metal having a hardness greater than that of the first metal in the inward direction. The first metal in the inward direction may have a ductility greater than that of the second metal in the outward direction.

According to various example embodiments, each of the first metal and the second metal may include at least one of Ti, Al, Mg, Zn, SS, Cu, and/or a liquid metal, but is not limited thereto. According to an example embodiment, each of the first metal and the second metal may include a clad metal in which two or more metals are stacked.

According to various example embodiments, the first range of the diameter of the first pores may be less than the second range of the diameter of the second pores.

According to various example embodiments, the first range may range from 20 nanometers (nm) to 40 nm, and the second range may range from 50 nm to 100 nm.

According to various example embodiments, a diameter and a depth of a pore may be determined by a difference in a reactivity between a metal (e.g., the first metal and the second metal) forming the metal portion (e.g., the first metal portion 410 and the second metal portion 420) and an electrolyte for forming an oxide film (e.g., the first oxide film layer 411 and the second oxide film layer 421).

According to various example embodiments, if a reactivity between a metal forming the metal portion and an electrolyte for forming an oxide film is good, an oxide film may be formed faster than a pore, and accordingly the pore may have a small diameter. If the reactivity between the metal forming the metal portion and the electrolyte for forming the oxide film is low, a pore may be formed faster than an oxide film, and accordingly the pore may have a large diameter. On the other hand, if the reactivity between the metal forming the metal portion and the electrolyte for forming the oxide film is good, a thick oxide film layer may be formed, and if the reactivity between the metal forming the metal portion and the electrolyte for forming the oxide film is low, a thin oxide film layer may be formed.

According to various example embodiments, the first oxide film layer 411 may have a first thickness, the second oxide film layer 421 may have a second thickness, and the first thickness and the second thickness may each be greater than or equal to 100 nm. According to various example embodiments, a pore may be formed in an oxide film layer, and a barrier layer in which a pore is not formed may be formed. According to an example embodiment, pores may be formed in the −Y direction from a surface of the first oxide film layer 411 in response to the anodizing process being performed, and the first oxide film layer 411 may include a first pore layer 413, in which the pores are formed, and a first barrier layer 414 as shown in FIG. 4. The first thickness of the first oxide film layer 411 may be obtained by adding a thickness of the first pore layer 413 and a thickness of the first barrier layer 414. According to an example embodiment, pores may be formed in the −Y direction from a surface of the second oxide film layer 421 in response to the anodizing process being performed, and the second oxide film layer 421 may include a second pore layer 423, in which pores are formed, and a second barrier layer 424. The second thickness of the second oxide film layer 421 may be obtained by adding a thickness of the second pore layer 423 and a thickness of the second barrier layer 424.

According to various example embodiments, the first thickness and the second thickness may be different.

According to various example embodiments, the first thickness and the second thickness may be determined by a reactivity between the first metal portion 410 and an electrolyte for forming an oxide film and a reactivity between the second metal portion 420 and the electrolyte for forming an oxide film, respectively. According to an example embodiment, pores may be formed in the −Y direction from each of the surface of the first metal portion 410 and the surface of the second metal portion 420, as the anodizing process is performed, and a depth of a pore and a thickness of a barrier layer may be determined based on a reactivity between each of the first metal portion 410 and the second metal portion 420 and the electrolyte.

According to various example embodiments, each of the first thickness of the first oxide film layer and the second thickness of the second oxide film layer may be greater than or equal to 100 nm. If the first thickness or the second thickness is less than 100 nm, the first metal portion, the second metal portion, and the non-conductive portion formed to cover at least a portion of the bonding portion between the first oxide film layer 411 and the second oxide film layer 421 may not be sufficiently bonded and may be separated.

According to various example embodiments, the first thickness or the second thickness may be greater than or equal to 1 micrometer (μm). According to various example embodiments, the first thickness may be greater than or equal to 1 μm, and the second thickness may be less than or equal to 1 μm.

According to various example embodiments, the first thickness may be greater or less than the second thickness, the first thickness may be greater than or equal to 1.4 μm, and the second thickness may be greater than or equal to 300 nm.

According to various example embodiments, each of the first oxide film layer 411 and the second oxide film layer 421 may contain an oxygen atom in an amount of 1 atomic percent (at. %) or greater and a fluorine atom in an amount of 0.01 at. % or greater.

According to various example embodiments, each of the first oxide film layer 411 and the second oxide film layer 421 may be formed by an electrolyte for forming an oxide film. An oxide film layer containing oxygen and fluorine may be formed on a metal portion through an anodizing process by immersion in an electrolyte for forming an oxide film.

According to various example embodiments, each of the first oxide film layer 411 and the second oxide film layer 421 may contain a fluorine atom in an amount of 1 at. % or greater, and desirably, 2 at. % or greater.

According to various example embodiments, each of the first oxide film layer 411 and the second oxide film layer 421 may contain an oxygen atom in an amount of 1 at. % or greater, 2 at. % or greater, 3 at. % or greater, 4 at. % or greater, 5 at. % or greater, 6 at. % or greater, 7 at. % or greater, 8 at. % or greater, 9 at. % or greater than, or 10 at. % or greater.

According to various example embodiments, the non-conductive portion 430 may be formed to fill either one or both of the first pores of the first oxide film layer 411 and the second pores of the second oxide film layer 421.

According to various example embodiments, the non-conductive portion 430 may be formed to cover at least a portion of the bonding portion 440 between the first oxide film layer 411 and the second oxide film layer 421, and may be formed to cover at least a portion of a surface of each of the first oxide film layer 411 and the second oxide film layer 421. According to an example embodiment, a surface of each of the first oxide film layer 411 and the second oxide film layer 421 may include both of a portion in which a pore is not formed, and inner walls of pores (e.g., the first pores 412 and the second pores 422) formed in each of the first oxide film layer 411 and the second oxide film layer 421.

According to various example embodiments, the non-conductive portion 430 may be bonded to the first metal portion 410 and the second metal portion 420 to electrically disconnect at least a portion of the first metal portion 410 and/or the second metal portion 420, and accordingly at least a portion of the first metal portion 410 and/or the second metal portion 420 may be used as an antenna of an electronic device. The non-conductive portion 430 may not be separated from the first metal portion 410 and the second metal portion 420 through sufficient bonding.

According to various example embodiments, the non-conductive portion 430 may be formed to fill either one or both of the first pores of the first oxide film layer 411 and the second pores of the second oxide film layer 421, so as to be in contact with either one or both of the first oxide film layer 411 and the second oxide film layer 421, with a larger surface area, thereby having a high bonding strength.

According to various example embodiments, the non-conductive portion 430 may include any one or any combination of polybutylene terephthalate (PBT), polycarbonate (PC), polyphenylene sulfide (PPS), acrylonitrile butadiene styrene (ABS), polyimide (PI), polyoxymethylene (POM), polyether ether ketone (PEEK), polyaryletherketone (PAEK) and polyphenylene oxide (PPO).

According to various example embodiments, the non-conductive portion 430 may include an engineering plastic. The engineering plastic may be a plastic with a high strength and a heat resistance to 100° C. or higher, and may be excellent in impact resistance, abrasion resistance, cold resistance, chemical resistance, electrical insulation, and the like. However, the type of plastics that may be included in a non-conductive portion is not limited.

According to various example embodiments, the non-conductive portion 430 may further include at least one additive among a glass fiber, a carbon fiber, talc, and wollastonite.

According to various example embodiments, the non-conductive portion 430 may further include an additive, to enhance at least one of heat resistance, strength, impact resistance, and/or abrasion resistance of the non-conductive portion.

According to various example embodiments, the first metal portion 410 and the second metal portion 420 may have a bonding strength of 10 megapascals (MPa) to 100 MPa.

According to various example embodiments, the first metal portion 410 and the second metal portion 420 may be bonded, and desirably, may be bonded with a bonding strength of 20 MPa to 100 MPa.

According to various example embodiments, a bonding strength between the first metal portion 410 and the non-conductive portion 430, and a bonding strength between the second metal portion 420 and the non-conductive portion 430 may each be 25 MPa or greater.

According to various example embodiments, the non-conductive portion 430 may be formed to cover at least a portion of each of the first oxide film layer 411 formed on the surface of the first metal portion 410 and the second oxide film layer 421 formed on the surface of the second metal portion 420.

According to various example embodiments, the non-conductive portion 430 may be formed on at least a portion of the first oxide film layer 411 and the second oxide film layer 421, and each of the first oxide film layer 411 and the second oxidation film layer 421 may have a bonding strength of 25 MPa or greater with the non-conductive portion 430. If the bonding strength with the non-conductive portion 430 is less than 25 MPa, a portion or all portions of the non-conductive portion 430 may be separated, and accordingly it may be difficult to use the housing 400 as a housing of an electronic device.

According to various example embodiments, the housing 400 may have a vacuum level of $1.0 \times 10^{-9}$ Pa m³/s or less according to a helium leak test based on ASTM E499. Through the helium leak test, whether helium gas passes, and a tightness of a bonding portion may be determined. If the vacuum level according to the helium leak test increases, an amount of helium gas that passes may increase, which may indicate that a housing of an electronic device is weakly bonded.

According to various example embodiments, the housing 400 may have an ingress protection rating of IPX6 or higher according to IEC 60529 that is a standard of the International Electrotechnical Commission (IEC).

According to various example embodiments, performance of the housing 400 may be measured according to the IEC 60529. According to IEC 60529, when 100 kilopascals (kPa) of water is sprayed for 3 minutes at 100 L/min in all directions within a range of 3 meters, when the housing 400 is waterproof, a rating of 6 may be set.

According to various example embodiments, the housing 400 may have a waterproof rating of 6 or higher, and the waterproof performance may be due to a bonding film formed between the first metal portion 410 and the second metal portion 420.

Figure 5:
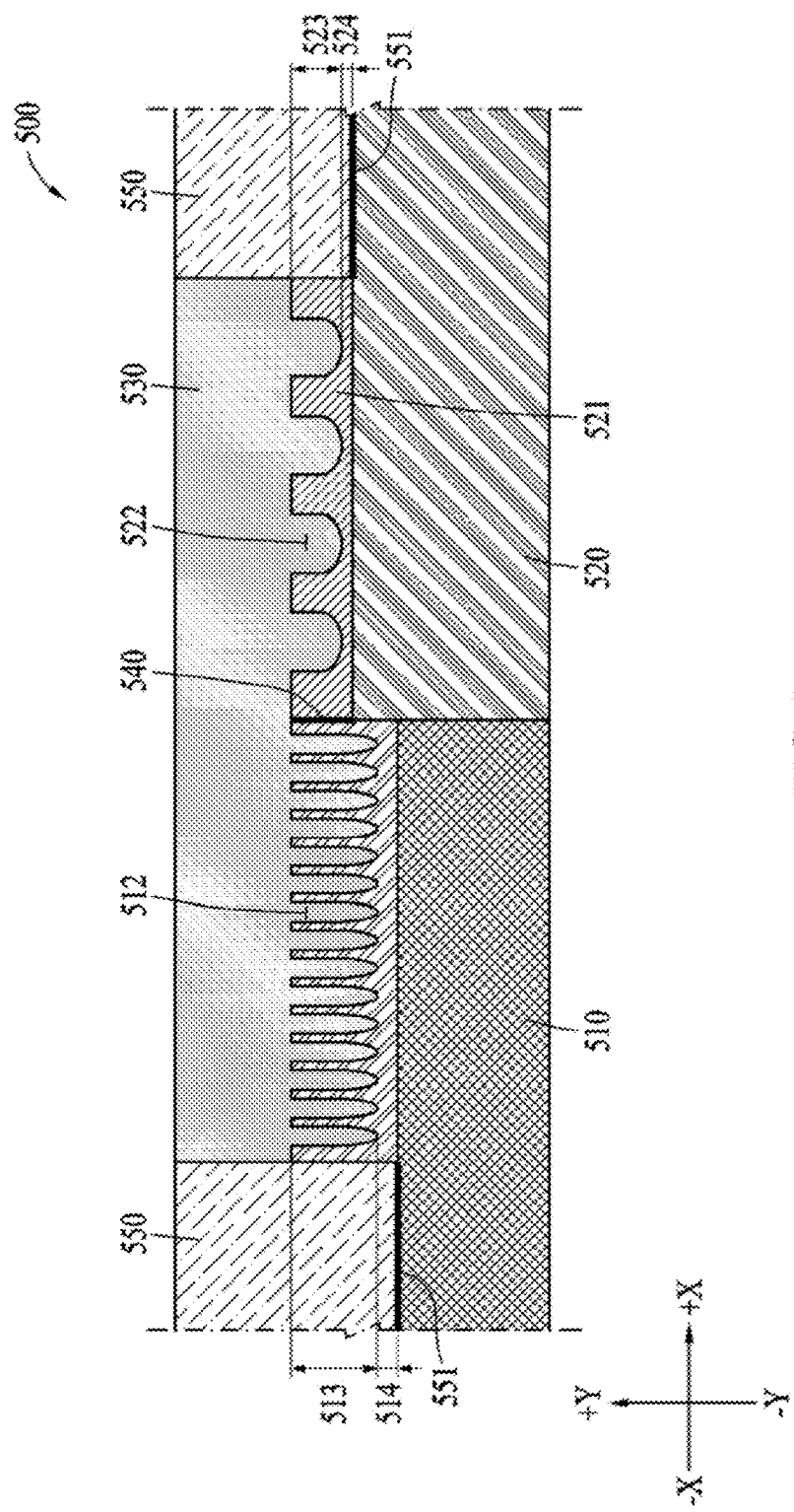
FIG. 5 is a cross-sectional view of a housing of an electronic device according to embodiments.

FIG. 5 is a cross-sectional view of a housing of an electronic device according to various example embodiments.

According to various example embodiments, a coating layer 550 may be formed on at least a portion (e.g., a second portion 551) of a surface of either one or both of the first metal portion 510 (e.g., the first metal portion 410 of FIG. 4) and the second metal portion 520 (e.g., the second metal portion 420 of FIG. 4) in the housing 500 (e.g., the housing 400 of FIG. 4). According to various example embodiments, the first oxide film layer 511 (e.g., the first oxide film layer 411 of FIG. 4) and the second oxide film layer 521 (e.g., the second oxide film layer 421 of FIG. 4) may be formed on at least a portion of a surface of either one or both of the first metal portion 510 and the second metal portion 520, and the coating layer 550 may be formed on at least a portion of a surface of each of the first metal portion 510 and the second metal portion 520 on which the first oxide film layer 511 and the second oxide film layer 521 are not formed. According to various example embodiments, the coating layer 550 may impart functionalities to a housing of an electronic device, and may assign, for example, at least one of an antistatic effect, anti-fingerprint effect, an anti-fouling effect, an anti-scratch effect, a low refraction, an anti-reflection effect, and/or a shock absorption effect.

According to various example embodiments, a coating layer 550 may not be formed on the non-conductive portion 530 (e.g., the non-conductive portion 430 of FIG. 4). In addition, a coating layer may not be formed through a separate coating layer removal process (e.g., a laser cutting process), even though the coating layer is formed on the non-conductive portion 530.

According to various example embodiments, the coating layer 550 may include, but is not limited to, any one or any combination of $Be_2SiO_4$, $Zn_2SiO_4$, $ZrSiO_4$, $(M_1^{2+})_3(M_2^{3+})_2(SiO_4)_3$ ($M_1$ is at least one of Ca, Mg and Fe, and $M_2$ is at least one of Al, Cr and Fe), a polyfunctional (meth)acrylate polymer having a (meth)acryl group, a polyfunctional urethane (meth)acrylate oligomer having 6 to 15 (meth)acryl groups, a polyfunctional (meth)acrylate monomer having 2 to 6 (meth)acryl groups, and a fluorinated (meth)acrylate monomer.

According to various example embodiments, the housing 400 may be formed to enclose the electronic device.

According to various example embodiments, an electronic device enclosed by a housing 400 of the electronic device may be provided. The housing 400 may include a first metal portion 410 including a first metal, a second metal portion 420 including a second metal, and a non-conductive portion 430. A first oxide film layer 411 may be formed on a surface of the first metal portion 410, and the first oxide film layer 411 may include a plurality of pores having a first diameter. The second metal portion 420 may be formed to be in contact with the first metal portion 410, a second oxide film layer 421 may be formed on a surface of the second metal portion 420, and the second oxide film layer 421 may include a plurality of pores having a second diameter. The non-conductive portion 430 may be formed to cover at least a portion of a bonding portion between the first oxide film layer 411 and the second oxide film layer 421.

According to various example embodiments, the electronic device may include, but is not limited to, a portable electronic device, a wearable electronic device, and a laptop.

The housing 400 according to various example embodiments may be a portion of a housing of an electronic device (e.g., the electronic device 100 of FIG. 1), and may include a metal portion and a non-conductive portion. According to an example embodiment, the housing 400 may include the first metal portion 410, the second metal portion 420, and the non-conductive portion 430. According to an example embodiment, the first metal portion 410 may include a first metal, for example, aluminum (Al). Also, the second metal portion 420 may include a second metal, for example, titanium (Ti). Here, the first metal portion 410 including Al may be disposed in an inward direction of the housing 400, and the second metal portion 420 including Ti may be disposed in an outward direction of the housing 400. Al may be light, and at least one of a brightness and/or a strength of Ti may be high. For example, the inward direction and the outward direction of the housing 400 may indicate an inward direction and an outward direction with respect to the electronic device 100, respectively. An oxide film layer may be formed on at least a portion of a surface of each of the first metal portion 410 including Al and the second metal portion 420 including Ti. For example, the first oxide film layer 411 may be formed on at least a portion of the surface of the first metal portion 410, and the second oxidation film layer 421 may be formed on at least a portion of the surface of the second metal portion 420. The first oxide film layer 411 and the second oxide film layer 421 may be formed by immersing the first metal portion 410 and the second metal portion 420, which are bonded, in a first solution (e.g., an electrolyte), as an anodizing process is performed, and pores may be formed in the first oxide film layer 411 and the second oxide film layer 421. According to various example embodiments, a first pore 412 formed in the first oxide film layer 411 may have a diameter in the first range, and a second pore 422 formed in the second oxide film layer 421 may have a diameter in the second range. The plurality of first pores 412 may be identical to or different from each other in at least one of a diameter, a height, and/or a shape, and the plurality of second pores 422 may be identical to or different from each other in at least one of a diameter, a height, and/or a shape. According to various example embodiments, the first solution in which the first metal portion 410 and the second metal portion 420 are immersed may contain at least one fluoride among ammonium bifluoride, hydrofluoric acid, sodium fluoride, potassium fluoride, and ammonium fluoride in an amount of 0.1% by weight (wt %) to 5 wt %, and a fluorine component may be detected from the first oxide film layer 411 and the second oxide film layer 421. Desirably, the first oxide film layer 411 and the second oxide film layer 421 may each contain fluorine in an amount of 0.01 at. % or greater. According to various example embodiments, the non-conductive portion 430 may be formed to fill at least one of pores of the first oxide film layer 411 and/or pores of the second oxide film layer 421. The non-conductive portion 430 may include any one or any combination of polybutylene terephthalate (PBT), polycarbonate (PC), polyphenylene sulfide (PPS), acrylonitrile butadiene styrene (ABS), polyimide (PI), polyoxymethylene (POM), polyether ether ketone (PEEK), polyaryletherketone (PAEK) and polyphenylene oxide (PPO). According to various example embodiments, at least a portion of the first metal portion 410 and the second metal portion 420 may be used as an antenna radiator (e.g., a first antenna radiator and a second antenna radiator, respectively), and at least a portion of the non-conductive portion 430 may provide electrical disconnection such that at least a portion of a metal portion (e.g., the first metal portion 410 and the second metal portion 420) may be used as an antenna radiator.

Figure 6:
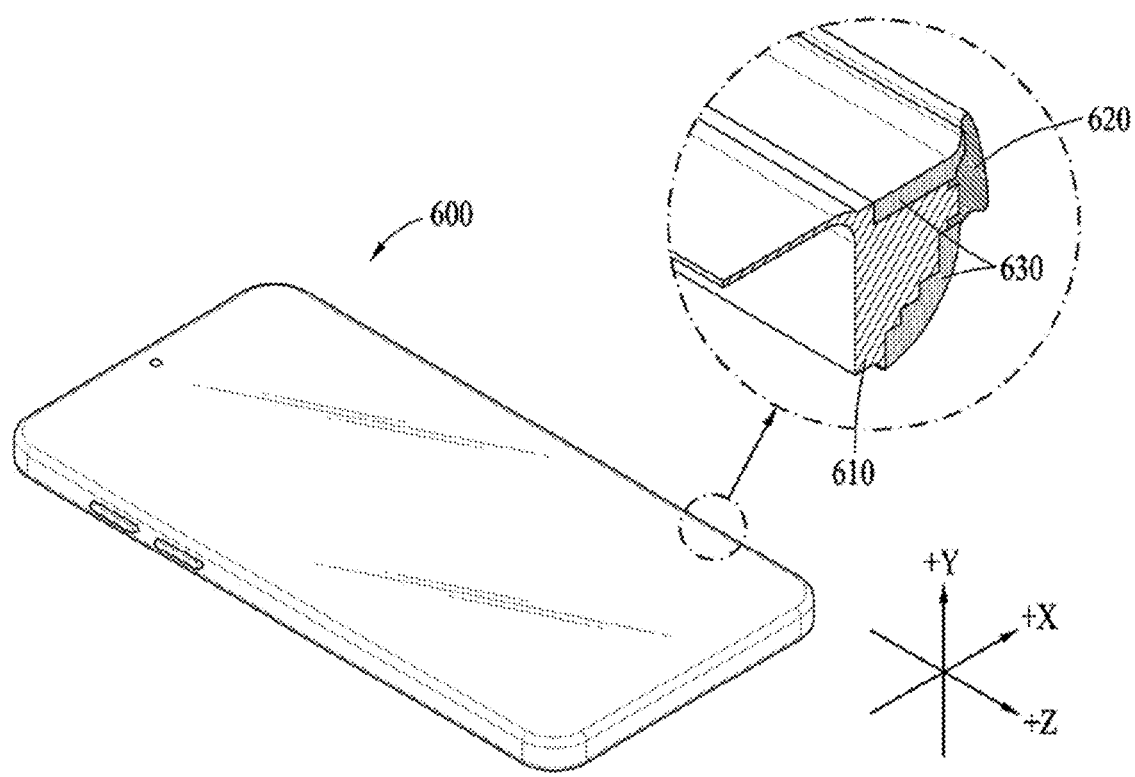
FIG. 6 is a cross-sectional view of a housing of an electronic device according to embodiments.

FIG. 6 is a cross-sectional view of a housing of an electronic device according to various example embodiments.

FIG. 6 illustrates a position relationship between components of a housing 600 of an electronic device as a housing (e.g., the housing 110 of FIG. 1) of an electronic device (e.g., the electronic device 100 of FIG. 1), however, a structure and position of each of the components are not limited.

Referring to FIG. 6, the housing 600 (e.g., the housing 400 of FIG. 4) may include a first metal portion 610 (e.g., the first metal portion 410 of FIG. 4), a second metal portion 620 (e.g., the second metal portion 420 of FIG. 4) and a non-conductive portion 630 (e.g., the non-conductive portion 430 of FIG. 4), and an oxide film layer may be formed on a surface of each of the first metal portion 610 and the second metal portion 620 through an anodizing process. The housing 600 may be a portion of the housing of the electronic device (e.g., the electronic device 100 of FIG. 1), and may be included in a side bezel, for example. For example, the first metal portion 610 may be positioned in an inward direction (e.g., a −X direction), and the second metal portion 620 may be positioned in an outward direction (e.g., a +X direction). A first metal included in the first metal portion 610 may be a metal for reducing a weight of the housing 600 and may include, for example, a metal lighter than a second metal included in the second metal portion 620. The second metal portion 620 may include the second metal, and a metal having a high strength for protecting the inside or a metal having a high brightness for providing a fine view may be used as the second metal. The second metal may be a metal having at least one of a brightness and/or a strength greater than that of the first metal. The non-conductive portion 630 may be formed to cover at least a portion of a bonding portion (e.g., the bonding portion 440 of FIG. 4) between the first metal portion 610 and the second metal portion 620 and may be bonded to a surface of each of the first metal portion 610 and the second metal portion 620.

According to various example embodiments, the first metal and the second metal may be different from each other.

According to various example embodiments, each of the first metal and the second metal may include at least one of Ti, Al, Mg, Zn, SS, Cu, and a liquid metal.

According to various example embodiments, the first diameter of the first pores of the first oxide film layer may be less than the second diameter of the second pores of the second oxide film layer.

According to various example embodiments, the first oxide film layer (e.g., the first oxide film layer 411 of FIG. 4) may have a first thickness, and the second oxide film layer (e.g., the second oxide film layer 421 of FIG. 4) may have a second thickness, and each of the first thickness and the second thickness may be greater than or equal to 100 nm.

According to various example embodiments, each of the first oxide film layer (e.g., the first oxide film layer 411 of FIG. 4) and the second oxide film layer (e.g., the second oxide film layer 421 of FIG. 4) may contain an oxygen atom in an amount of 1 at. % or greater and a fluorine atom in an amount of 0.01 at. % or greater.

According to various example embodiments, the non-conductive portion (e.g., the non-conductive portion 430 of FIG. 4) may be formed to fill either one or both of first pores of the first oxide film layer (e.g., the first oxide film layer 411 of FIG. 4) and second pores of the second oxide film layer (e.g., the second oxide film layer 421 of FIG. 4).

According to various example embodiments, the non-conductive portion (e.g., the non-conductive portion 430 of FIG. 4) may include any one or any combination of polybutylene terephthalate (PBT), polycarbonate (PC), polyphenylene sulfide (PPS), acrylonitrile butadiene styrene (ABS), polyimide (PI), polyoxymethylene (POM), polyether ether ketone (PEEK), polyaryletherketone (PAEK) and polyphenylene oxide (PPO).

According to various example embodiments, the non-conductive portion (e.g., the non-conductive portion 430 of FIG. 4) may further include at least an additive among a glass fiber, a carbon fiber, talc, and wollastonite.

According to various example embodiments, a bonding strength between the first metal portion (e.g., the first metal portion 410 of FIG. 4) and the second metal portion (e.g., the second metal portion 420 of FIG. 4) may be 10 MPa to 100 MPa.

According to various example embodiments, each of the first metal portion (e.g., the first metal portion 410 of FIG. 4) and the second metal portion (e.g., the second metal portion 420 of FIG. 4) may have a bonding strength of 25 MPa or greater with the non-conductive portion (e.g., the non-conductive portion 430 of FIG. 4).

According to various example embodiments, the housing (e.g., the housing 400 of FIG. 4) of the electronic device may have a vacuum degree of $1.0 \times 10^{-9}$ Pa m$^3$/s or less according to a helium leak test based on ASTM E499.

According to various example embodiments, the housing (e.g., the housing 400 of FIG. 4) of the electronic device may have a rating of IPX6 or higher according to the IEC 60529 that is the standard of the IEC.

According to various example embodiments, the electronic device may be at least one of a portable electronic device, a wearable electronic device, and a laptop.

Figure 7:
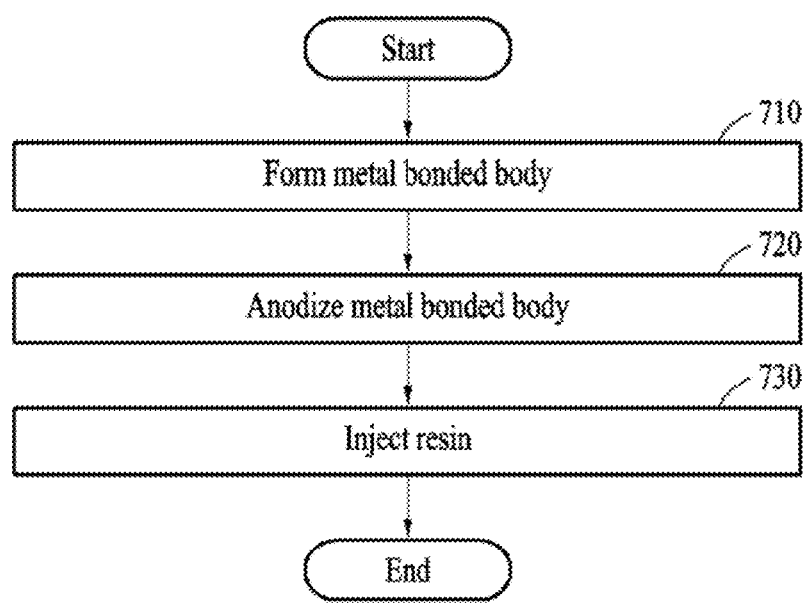
FIG. 7 is a flowchart illustrating a method of manufacturing a housing of an electronic device according to embodiments.

FIG. 7 is a flowchart illustrating a method of manufacturing a housing of an electronic device according to various example embodiments.

According to various example embodiments, the method of FIG. 7 may include operation 710 of forming a metal bonded body by bonding a first metal and a second metal, operation 720 of anodizing the metal bonded body through immersion in a first solution, and operation 730 of injecting a resin onto the metal bonded body.

According to various example embodiments, in operation 710, the metal bonded body may be formed by bonding the first metal and the second metal. To bond the first metal and the second metal, the first metal and the second metal may be welded, an adhesive material may be used, or casting or caulking may be performed. For example, the metal bonded body may include the first metal portion 410 and the second metal portion 420 illustrated in FIG. 4. According to various example embodiments, each of the first metal and the second metal may include at least one of Ti, Al, Mg, Zn, SS, Cu, and/or a liquid metal, but is limited thereto. According to various example embodiments, each of the first metal and the second metal may include a clad metal in which two or more metals are stacked. For example, in operation 710, bonding may be performed by welding the first metal and the second metal determined by selecting at least one of Ti, Al, Mg, Zn, SS, Cu, and/or a liquid metal, by using an adhesive material, or by performing casting or caulking.

According to various example embodiments, when the metal bonded body is formed, a blasting process or a laser hatching process may be performed. Through the blasting process, a scale, rust, coating, etc. of the metal bonded body may be washed.

According to various example embodiments, the first solution may contain at least one fluoride among ammonium bifluoride, hydrofluoric acid, sodium fluoride, potassium fluoride, and ammonium fluoride in an amount of 0.1 wt % to 10 wt %.

According to various example embodiments, the first solution may include fluoride. The fluoride may be used to easily form an oxide film on titanium (Ti), in particular.

According to various example embodiments, the first solution may further include triazine thiol. The triazine thiol may be represented as shown in Formula 1 below.

[Formula 1]

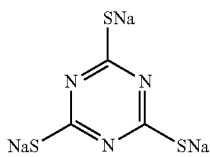

According to various example embodiments, the first solution may further include sulfuric acid. The first solution may further include at least one additive among a hydrochloric acid, a phosphoric acid, a nitric acid, an oxalic acid, a chromic acid, a sulfamic acid, a malonic acid, an organic acid, a sodium hydroxide, and sodium sulfate.

According to various example embodiments, operation 720 may be performed by applying a current at a temperature of 20° C. to 80° C. and a voltage of 10 V to 30 V.

According to various example embodiments, in operation 730, a resin including any one or any combination of polybutylene terephthalate (PBT), polycarbonate (PC), polyphenylene sulfide (PPS), acrylonitrile butadiene styrene (ABS), polyimide (PI), polyoxymethylene (POM), polyether ether ketone (PEEK), polyaryletherketone (PAEK) and polyphenylene oxide (PPO) may be injected onto the metal bonded body. The resin may be injected so as to cover an oxide film on the metal bonded body formed through an anodizing process. For example, the resin may not be injected onto a region, in which the oxide film is not formed, of a surface of the metal bonded body. According to various example embodiments, a non-conductive portion having a low conductivity may be formed according to operation 730.

Figure 8:
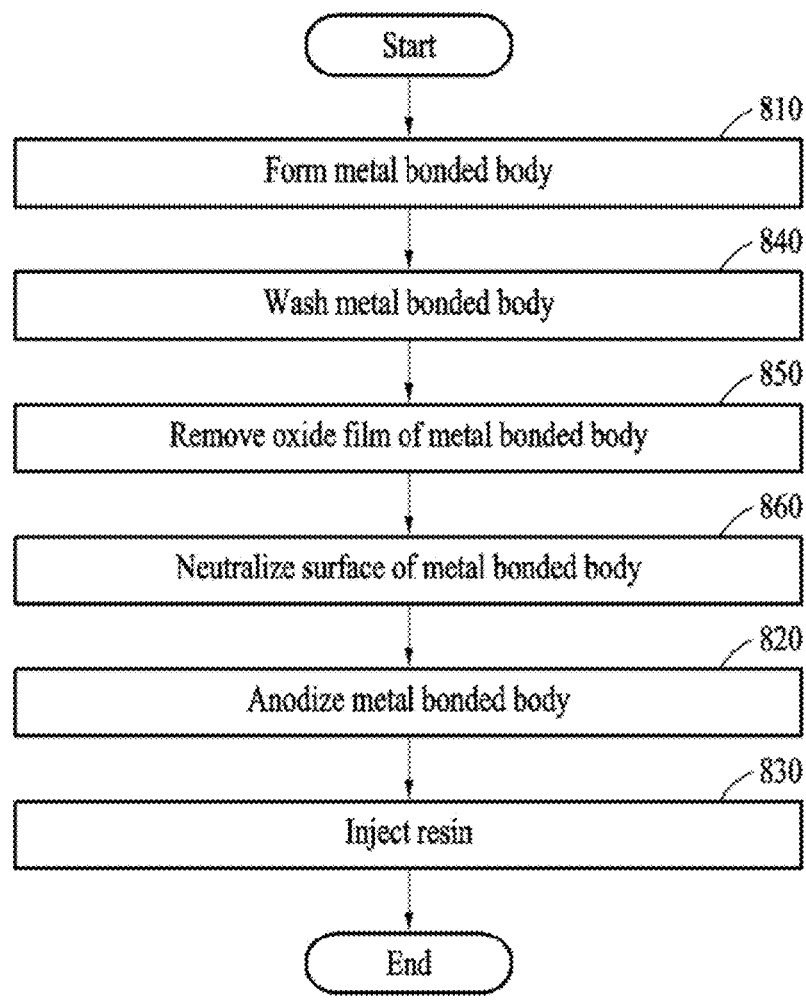
FIG. 8 is a flowchart illustrating a method of manufacturing a housing of an electronic device according to embodiments.

FIG. 8 is a flowchart illustrating a method of manufacturing a housing of an electronic device according to various example embodiments.

According to various example embodiments, the method of FIG. 8 may include operation 810 (e.g., operation 710 of FIG. 7) of forming a metal bonded body by bonding a first metal and a second metal, operation 820 (e.g., operation 720 of FIG. 7) of anodizing the metal bonded body through immersion in a first solution and operation 830 (e.g., operation 730 of FIG. 7) of injecting a resin onto the metal bonded body.

According to various example embodiments, the method may selectively further include, prior to operation 820 (e.g., operation 720 of FIG. 7), operation 840 of washing the metal bonded body, operation 850 of removing an oxide film of the metal bonded body, and operation 860 of neutralizing a surface of the metal bonded body.

According to various example embodiments, operation 840 of washing the metal bonded body may be performed at a temperature of 20° C. to 60° C., and may be performed using ultrasonic waves. Operation 840 of washing the metal bonded body may be performed using a second solution containing a surfactant.

According to various example embodiments, operation 850 of removing the oxide film of the metal bonded body may be performed using a strong alkaline third solution such as caustic soda. Since the third solution is strongly alkaline, smut may be generated on the surface of the metal bonded body. To remove the smut, an operation of depositing the metal bonded body in a fourth solution containing at least one of nitric acid, sulfuric acid and fluoride may be additionally performed. The operation of depositing the metal bonded body in the fourth solution may be performed for 10 seconds to 600 seconds and may be performed at a temperature of 20° C. to 70° C., desirably 20° C. to 50° C.

According to various example embodiments, operation 860 of neutralizing the surface of the metal bonded body may be performed to neutralize the surface and remove contaminants that interfere with formation of an oxide film.

According to various example embodiments, operation 860 of neutralizing the surface of the metal bonded body may be performed by depositing the metal bonded body in a fifth solution containing at least one of sulfuric acid, nitric acid, and fluoride. Operation 860 of neutralizing the surface of the metal bonded body may be performed at a temperature of 20° C. to 70° C., and may be performed for 30 seconds to 600 seconds.

According to various example embodiments, the method may further include, after operation 830, an operation of forming a coating layer on the metal bonded body using at least one method among PVD, CVD, wet plating, electrodeposition, painting, plasma electrolytic oxidation (PEO), anodizing and printing. According to various example embodiments, the housing of the electronic device may include a coating layer (e.g., the coating layer 550 of FIG. 5) that exhibits at least one of an antistatic effect, anti-fingerprint effect, an anti-fouling effect, an anti-scratch effect, a low refraction, an anti-reflection effect, and/or a shock absorption effect. For example, by forming the coating layer (e.g., the coating layer 550 of FIG. 5), it may be possible to provide an excellent sense of touch to the electronic device and prevent contamination from occurring.

According to various example embodiments, the first solution may contain at least one fluoride among ammonium bifluoride, hydrofluoric acid, sodium fluoride, potassium fluoride, and ammonium fluoride in an amount of 0.1 wt % to 5 wt %.

According to various example embodiments, the first solution may further include sulfuric acid. The first solution may further include at least one additive among a hydrochloric acid, a phosphoric acid, a nitric acid, an oxalic acid, a chromic acid, a sulfamic acid, a malonic acid, an organic acid, a sodium hydroxide, and sodium sulfate.

According to various example embodiments, an anodizing process (e.g., operation 720 of FIG. 7) may be performed by applying a current at a temperature of 20° C. to 80° C. and a voltage of 10 V to 30 V.

According to various example embodiments, prior to performing the anodizing process (e.g., operation 720 of FIG. 7 and operation 820 of FIG. 8), a process (e.g., operation 840 of FIG. 8) of washing the metal bonded body, a process (e.g., operation 850 of FIG. 8) of removing an oxide film of the metal bonded body, and a process (e.g., operation 860 of FIG. 8) of neutralizing the surface of the metal bonded body may be further performed.

Hereinafter, the disclosure will be described in more detail with reference to examples and comparative examples.

However, the following examples are for illustrative purposes only and are not intended to limit the scope of the disclosure.

EXAMPLES

An aluminum alloy and a titanium alloy may be prepared. Here, the aluminum alloy may have a purity of 70% to 100%, and the titanium alloy may have a purity of 80% to 100%. A metal bonded body formed by bonding the aluminum alloy and the titanium alloy through a casting process may be immersed in a solution containing a surfactant and may be washed. The metal bonded body may be deposited in an alkaline solution containing sodium hydroxide to remove an oxide film from a surface of the metal bonded body. Smut may be generated during the deposition in the alkaline solution. Subsequently, the metal bonded body may be immersed in an acid solution to remove the smut, and then the metal bonded body may be deposited in an aqueous sulfuric acid solution for 60 seconds to neutralize the surface of the metal bonded body.

The metal bonded body preprocessed as described above may be deposited in an aqueous sulfuric acid solution containing fluoride and triazine thiol. Here, the aqueous sulfuric acid solution may include 1 wt % to 3 wt % of ammonium bifluoride, 1 wt % to 3 wt % of hydrofluoric acid, 1 wt % to 3 wt % of sulfuric acid, and water as the remainders. The anodizing process may be performed by applying a voltage of 10 V to 30 V at a temperature of 20° C. to 80° C., and an oxide film layer may be formed on one surface of the metal bonded body. After drying the metal bonded body, a resin containing at least one engineering plastic among polycarbonate, acrylonitrile butadiene styrene, polybutylene terephthalate, and polyaryletherketone may be injected onto the oxide film layer to manufacture a housing of an electronic device.

Experimental Example 1

Figure 9:
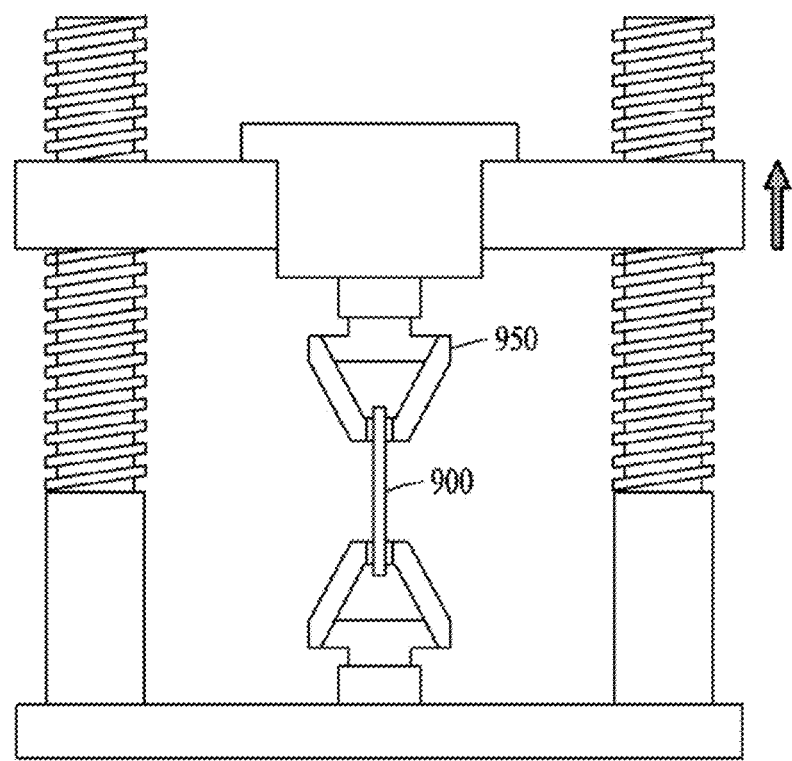
FIG. 9 is a diagram schematically illustrating a tensile tester for measuring a bonding strength of a housing of an electronic device according to an embodiment.

A bonding strength of a housing of an electronic device may be measured. FIG. 9 is a diagram schematically illustrating a tensile tester for measuring a bonding strength of a housing of an electronic device according to an example embodiment.

When a housing 900 of an electronic device according to an example embodiment may be mounted on a tensile tester 950, a tensile force may be measured at a point in time when a resin and a metal portion are completely separated by pulling the tensile tester 950 in a direction indicated by an arrow.

A bonding strength formed by each of an aluminum portion and a titanium portion and the resin is measured and represented as shown in Table 1 below.

TABLE 1

|  | Al portion | Ti portion |
|---|---|---|
| Bonding strength [MPa] with resin | 32.5 | 27.8 |

Experimental Example 2

Components of an oxide film layer formed on a surface of each metal portion may be analyzed. The components of the oxide film layer formed on the surface of each metal portion may be analyzed through an energy dispersive X-ray spectroscopy (EDS). Components of each oxide film layer are represented as shown in FIGS. 10A and 10B and Table 2 below.

Figure 10A:
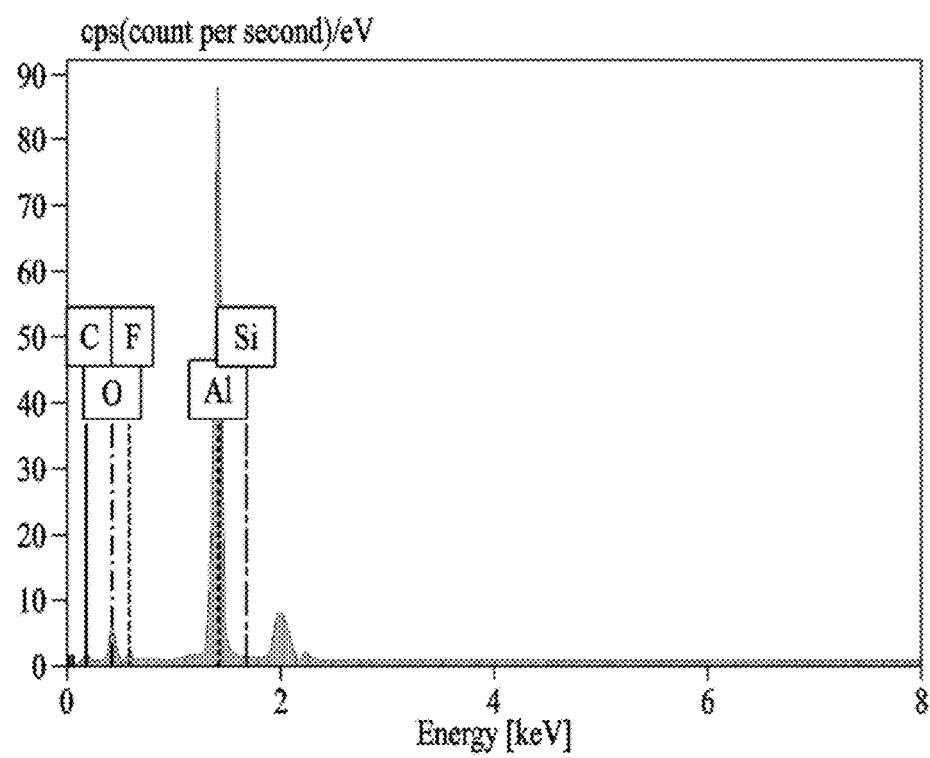
FIGS. 10A and 10B are graphs showing results of energy dispersive X-ray spectroscopy (EDS) analysis of a first oxide film layer and a second oxide film layer of a housing of an electronic device according to an embodiment.
Figure 10B:
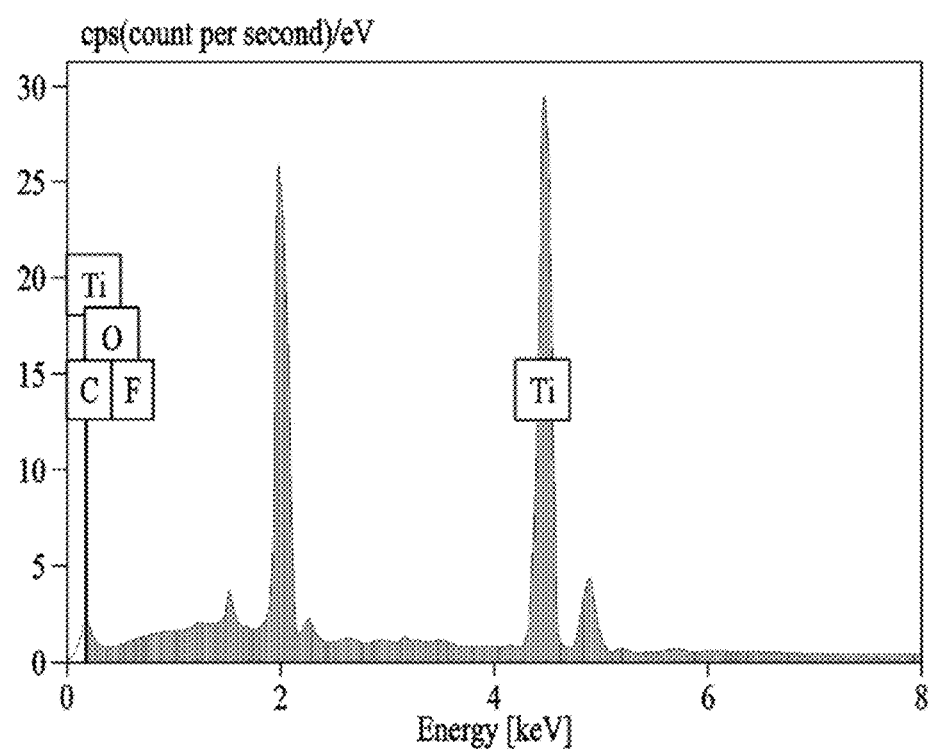

FIGS. 10A and 10B are graphs showing EDS analysis results of a first oxide film layer and a second oxide film layer of a housing of an electronic device according to an example embodiment.

TABLE 2

| Components [at. %] | Ti | O | C | F | Al | Si |
|---|---|---|---|---|---|---|
| Ti portion | 54.01 | 35.79 | 7.61 | 2.58 | — | — |
| Al portion | — | 25.34 | 16.15 | 4.75 | 53.75 | 0.02 |

Referring to FIG. 10A, an EDS analysis result of the aluminum portion may be confirmed. Referring to FIG. 10B, an EDS analysis result of the titanium portion may be confirmed. Referring to FIGS. 10A and 10B, it can be confirmed that each of the aluminum portion and the titanium portion contains fluorine in an amount of 2 at. % or greater.

Experimental Example 3

A thickness of an oxide film layer formed on a surface of each metal portion may be measured. The thickness of the oxide film layer may be represented as shown in FIGS. 11A and 11B by capturing a scanning electron microscope (SEM) image.

Figure 11A:
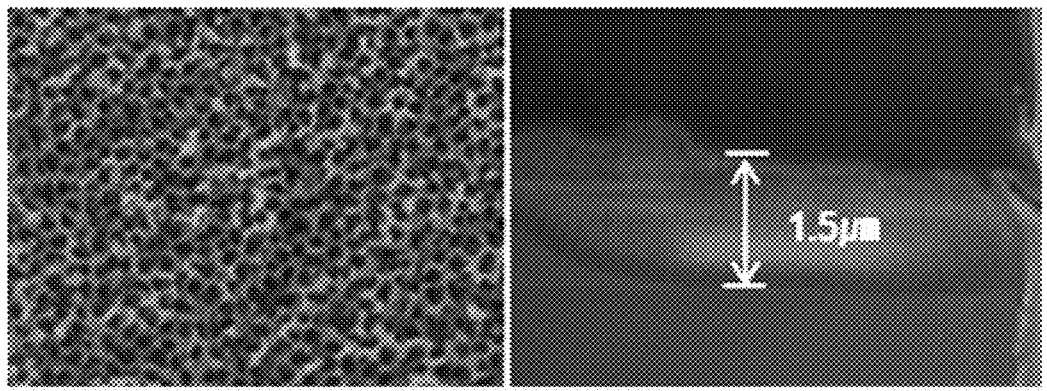
FIGS. 11A and 11B are scanning electron microscope (SEM) images of a first oxide film layer and a second oxide film layer of a housing of an electronic device according to an embodiment.
Figure 11B:
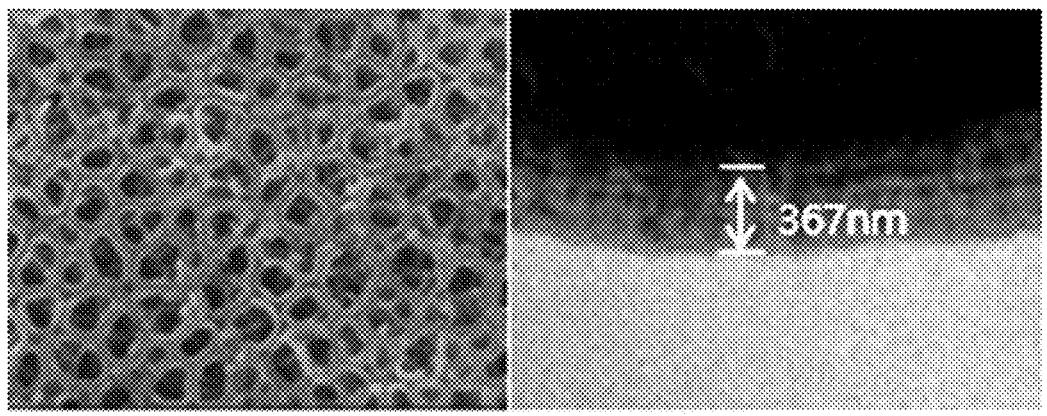

FIGS. 11A and 11B are SEM images of a first oxide film layer and a second oxide film layer of a housing of an electronic device according to an example embodiment.

Referring to FIG. 11A, an SEM image of an aluminum portion may be confirmed. Referring to FIG. 11B, an SEM image of a titanium portion may be confirmed. Referring to FIGS. 11A and 11B, it can be confirmed that pores formed in an oxide film layer of the aluminum portion have a diameter less than that of pores formed in an oxide film layer of the titanium portion, and that the oxide film layer formed in the aluminum portion has a thickness of 1.5 µm, but the oxide film layer formed in the titanium portion has a thickness of 367 nm.

The electronic device according to various example embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that various example embodiments of the disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

What is claimed is:

1. A housing of an electronic device, the housing comprising:
    a first metal portion comprising a first metal;
    a second metal portion comprising a second metal; and
    a non-conductive portion,
    wherein a first oxide film layer is formed on at least a portion of a surface of the first metal portion,
    wherein the first oxide film layer comprises a plurality of first pores, each of the plurality of first pores having a respective first diameter in a first range,
    wherein the second metal portion contacts the first metal portion,
    wherein a second oxide film layer is formed on at least a portion of a surface of the second metal portion,
    wherein the second oxide film layer comprises a plurality of second pores, each of the plurality of second pores having a respective second diameter in a second range, and
    wherein the non-conductive portion covers at least a portion of a bonding portion between the first oxide film layer and the second oxide film layer.

2. The housing of claim 1, wherein the first metal and the second metal are different from each other.

3. The housing of claim 2, wherein the first metal and the second metal each comprise at least one selected from a group consisting of Ti, Al, Mg, Zn, stainless steel, Cu, a liquid metal, and a mixture thereof.

4. The housing of claim 1, wherein the first range is less than the second range.

5. The housing of claim 1, wherein the first oxide film layer has a first thickness,
    wherein the second oxide film layer has a second thickness, and
    wherein each of the first thickness and the second thickness is greater than or equal to 100 nanometers (nm).

6. The housing of claim 1, wherein each of the first oxide film layer and the second oxide film layer comprises an oxygen atom in an amount of 1 atomic percent (at. %) or greater and a fluorine atom in an amount of 0.01 at. % or greater.

7. The housing of claim 1, wherein the non-conductive portion fills either one or both of the plurality of first pores and the plurality of second pores.

8. The housing of claim 1, wherein the non-conductive portion comprises at least one selected from a group consisting of polybutylene terephthalate (PBT), polycarbonate (PC), polyphenylene sulfide (PPS), acrylonitrile butadiene styrene (ABS), polyimide (PI), polyoxymethylene (POM), polyether ether ketone (PEEK), polyaryletherketone (PAEK), polyphenylene oxide (PPO), and a mixture thereof.

9. The housing of claim 8, wherein the non-conductive portion further comprises at least one additive selected from a group consisting of a glass fiber, a carbon fiber, talc, wollastonite, and a mixture thereof.

10. The housing of claim 1, wherein a bonding strength between the first metal portion and the second metal portion is 10 megapascals (MPa) to 100 MPa, and wherein a bonding strength of each of the first metal portion and the second metal portion with the non-conductive portion is 25 MPa or greater.

11. The housing of claim 1, wherein each of the first oxide film layer and the second oxide film layer comprises a fluorine atom in an amount of 1 at. % or greater.

12. The housing of claim 1, wherein a coating layer is formed on at least a second portion of the surface of either one or both of the first metal portion and the second metal portion.

13. The housing of claim 12, wherein the coating layer comprises at least one selected from a group consisting of $Be_2SiO_4$, $Zn_2SiO_4$, $ZrSiO_4$, $(M_1^{2+})_3(M_2^{3+})_2(SiO_4)_3$ ($M_1$ is at least one of Ca, Mg and Fe, and $M_2$ is at least one of Al, Cr and Fe), a polyfunctional (meth)acrylate polymer having a (meth)acryl group, a polyfunctional urethane (meth)acrylate oligomer having 6 to 15 (meth)acryl groups, a polyfunctional (meth)acrylate monomer having 2 to 6 (meth)acryl groups, a fluorinated (meth)acrylate monomer, and a mixture thereof.

14. An electronic device comprising a housing, wherein the housing comprises:
    a first metal portion comprising a first metal;
    a second metal portion comprising a second metal; and
    a non-conductive portion,
    wherein a first oxide film layer is formed on at least a portion of a surface of the first metal portion,
    wherein the first oxide film layer comprises a plurality of first pores having a first diameter,
    wherein the second metal portion contacts the first metal portion,
    wherein a second oxide film layer is formed on at least a portion of a surface of the second metal portion,
    wherein the second oxide film layer comprises a plurality of second pores having a second diameter, and wherein the non-conductive portion covers at least a portion of a bonding portion between the first oxide film layer and the second oxide film layer.

15. The electronic device of claim 14, wherein the first metal and the second metal each comprise at least one selected from a group consisting of Ti, Al, Mg, Zn, stainless steel, Cu, a liquid metal, and a mixture thereof, and wherein each of the first oxide film layer and the second oxide film layer comprises an oxygen atom in an amount of 1 atomic percent (at. %) or greater and a fluorine atom in an amount of 0.01 at. % or greater.

16. The electronic device of claim 14, wherein the electronic device comprises at least one of a portable electronic device, a wearable electronic device, and a laptop.

17. A housing of an electronic device, the housing comprising:

a first metal portion comprising a plurality of first protrusions on a surface of the first metal portion, a second metal portion comprising a plurality of second protrusions on a surface of the second metal portion, and the first metal portion and the second metal portion being in physical contact with each other, and the plurality of first protrusions forming an antenna radiator; and a non-conductive portion on the surface of the first metal portion and on the surface of the second metal portion and filling spaces between adjacent protrusions of the plurality of first protrusions and filling spaces between adjacent protrusions of the plurality of second protrusions.

* * * * *